(12) United States Patent
Lukanc et al.

(10) Patent No.: US 6,995,433 B1
(45) Date of Patent: Feb. 7, 2006

(54) MICRODEVICE HAVING NON-LINEAR STRUCTURAL COMPONENT AND METHOD OF FABRICATION

(75) Inventors: Todd P. Lukanc, San Jose, CA (US); Sarah N. McGowan, San Francisco, CA (US); Luigi Capodieci, Santa Cruz, CA (US); Bhanwar Singh, Morgan Hill, CA (US); Joerg Reiss, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 10/791,250

(22) Filed: Mar. 2, 2004

(51) Int. Cl.
*H01L 29/94* (2006.01)
*H01L 31/062* (2006.01)

(52) U.S. Cl. .................................... 257/366; 257/401
(58) Field of Classification Search ............... 257/366, 257/401
See application file for complete search history.

(56) References Cited

U.S. PATENT DOCUMENTS

| 5,777,360 A | * | 7/1998 | Rostoker et al. ............ 257/315 |
| 6,229,163 B1 | * | 5/2001 | Calafut ....................... 257/242 |

* cited by examiner

*Primary Examiner*—Tu-Tu Ho
(74) *Attorney, Agent, or Firm*—Renner, Otto, Boisselle & Sklar, LLP

(57) ABSTRACT

A microdevice for forming a part of an integrated circuit and method for fabricating are disclosed. The microdevice can include a first conductive region and a second conductive region having a channel region interposed therebetween. The mircodevice has a channel region controlling component disposed over the channel region and separated therefrom by at least one dielectric layer. The channel region controlling component has a non-linear structural characteristic derived from a non-linear structural characteristic of a photo resist feature used as an etch mask for the channel region controlling component.

13 Claims, 2 Drawing Sheets

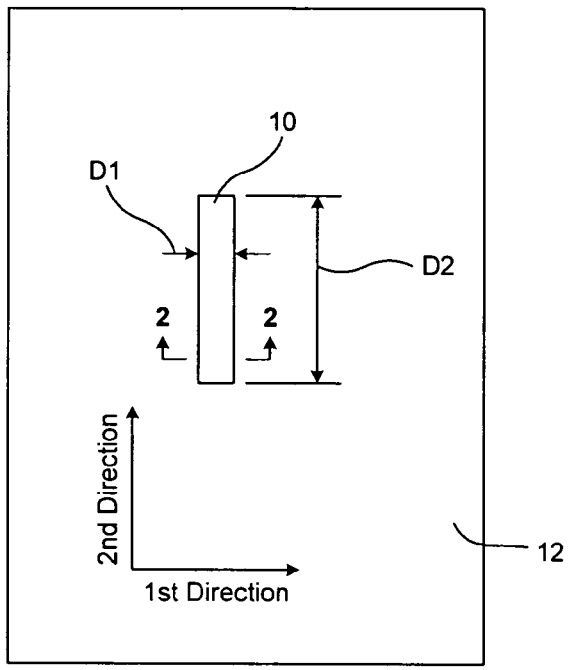
FIG. 1
Prior Art
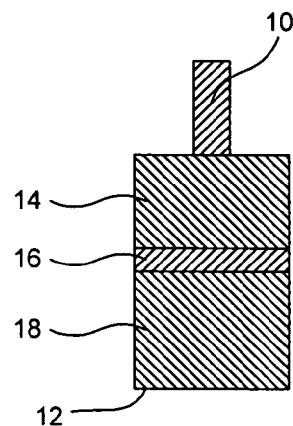
FIG. 2
Prior Art
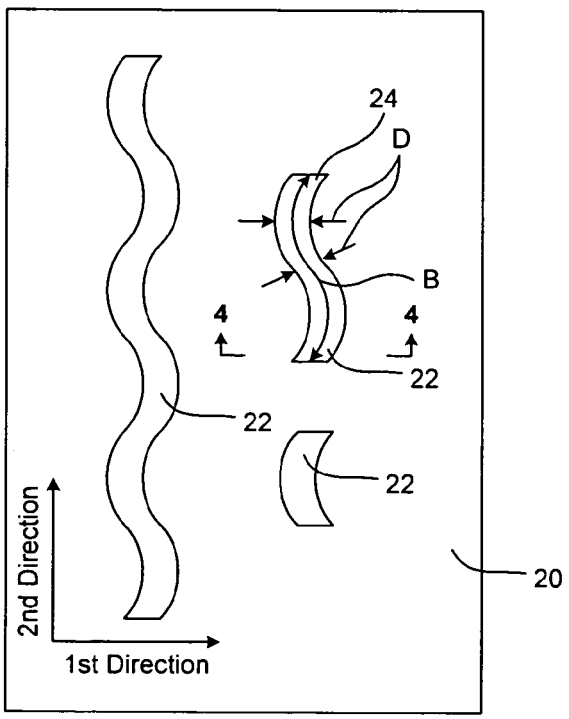
FIG. 3
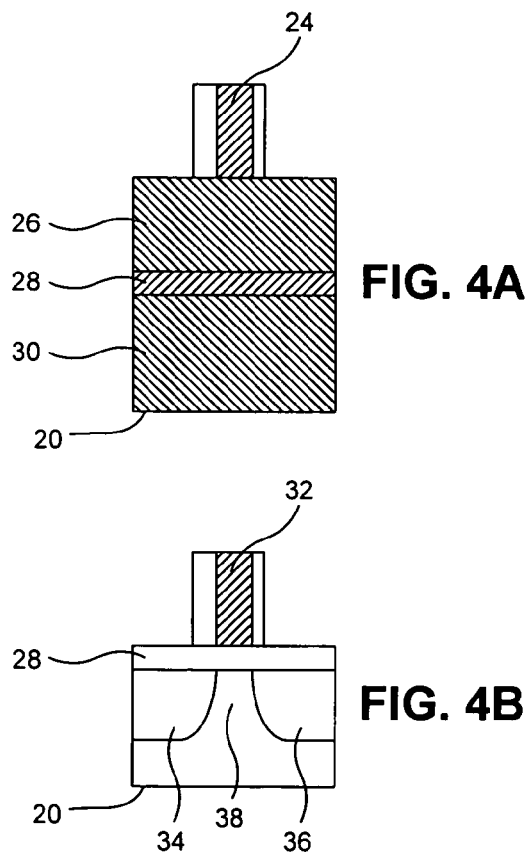
FIG. 4A
FIG. 4B

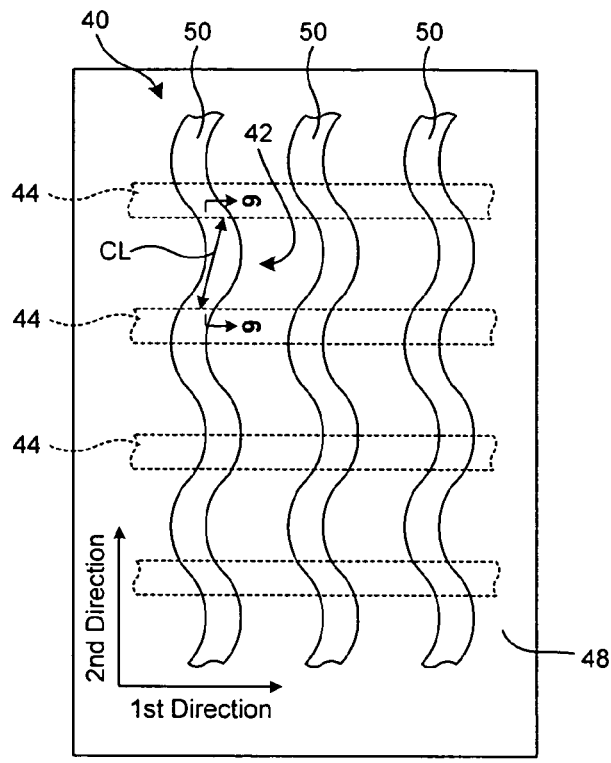
FIG. 5
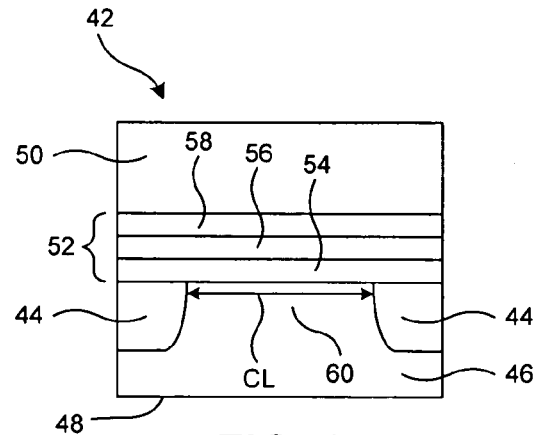
FIG. 6
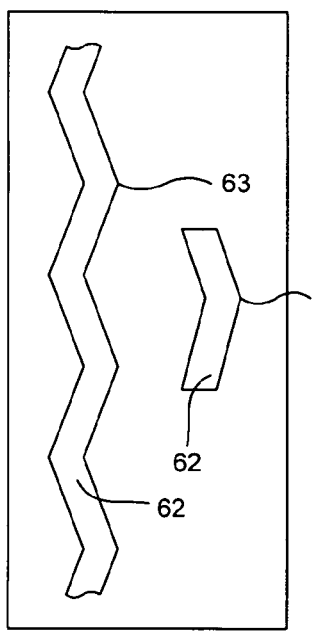
FIG. 7
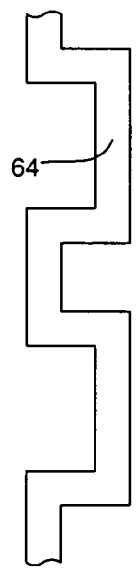
FIG. 8
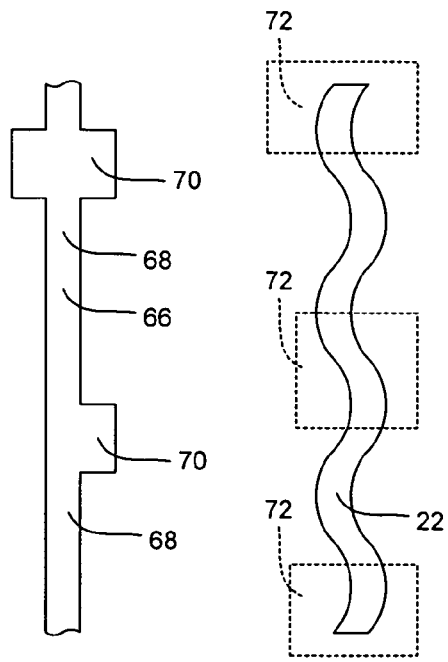
FIG. 9
FIG. 10

US 6,995,433 B1

MICRODEVICE HAVING NON-LINEAR STRUCTURAL COMPONENT AND METHOD OF FABRICATION

TECHNICAL FIELD

The present invention relates generally to the field of integrated circuits and their manufacture and, more particularly, to a microdevice (e.g., a transistor or memory cell) having a non-linear structural component and to a method of making a microdevice using a photoresist layer that is patterned to include a non-linear feature.

BACKGROUND

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photo resist layer disposed on the wafer by passing light energy through a photomask having an arrangement to image the desired pattern onto the photo resist layer. As a result, the pattern is transferred to the photo resist layer. Following a development cycle, the photoresist is selectively removed and the remaining resist serves to protect the underlying layer during further processing of the wafer (e.g., etching exposed portions of the underlying layer, implanting ions into the wafer, etc.). Thereafter, the remaining portions of the photo resist layer can be removed.

There is a pervasive trend in the art of IC fabrication to increase the density with which various structures are arranged. For example, feature size, line width, and the separation between features and lines are becoming increasingly smaller. For example, nodes with a critical dimension of about 45 nanometers (nm) to about 65 nm have been proposed. In these sub-micron processes, yield is affected by factors such as the quality of the patterned photo resist.

In situations where the photo resist is patterned to include a feature having a first dimension (e.g., a line width) that is small relative to a second dimension (e.g., a line length), the photo resist material comprising the feature can have a tendency to collapse. Collapsing can include completely falling over, leaning in one or more directions, bowing, "slumping," or otherwise failing to remain upright and disposed in a desired direction. As should be appreciated, if a photo resist feature collapses, the underlying layer will not be processed as desired and performance of the resulting integrated circuit could be severely compromised. This problem is can become acute when the photo resist has a relatively large height (e.g., high aspect ratio), especially when the height is large relative to the first dimension.

FIG. 1 illustrates a conventional photo resist line 10 disposed on a wafer 12. In this example, the photo resist line 10 is used to define the size and location of a gate electrode structure for a transistor, such as a metal oxide field effect transistor (MOSFET). The photo resist line 10 has a first dimension D1 disposed in a first direction and a second dimension D2 disposed in a second direction. FIG. 2 shows the photo resist line 10 and wafer 12 in cross-section taken along the line 2—2 of FIG. 1. In the illustrated example, the wafer 12 can include a polysilicon layer 14 disposed under the photo resist line 10. The polysilicon layer 14 can be disposed over a dielectric layer 16 that, in turn, can be disposed over a semiconductor substrate 18. The illustrated photo resist line 10 can be used to protect the polysilicon layer 14 during formation of a polysilicon gate electrode from the polysilicon layer 14. In this example, the first dimension D1 would ultimately define a gate length and the second dimension D2 would ultimately define a gate width.

Although illustrated in an upright position, the photo resist line 10 exhibits properties that could lead to collapse of the photo resist line 10 (e.g., the first dimension D1 is relatively small compared to the second dimension D2 and/or a height of the photo resist line 10). At least one attempt has been made to reduce the occurrence of photo resist feature collapse. This attempt included using a spin-on bottom anti-reflective coating (BARC) under the photo resist material to add stability to the resulting photo resist features. Although the BARC layer may contribute desired optical qualities, this technique has not satisfactorily resulted in avoiding photo resist feature collapse.

Accordingly, there exists a need in the art for improved mircodevices and manufacturing techniques that have a reduced susceptibility to photo resist feature collapse.

SUMMARY OF THE INVENTION

According to one aspect of the invention, the invention is directed to a microdevice for forming a part of an integrated circuit. The microdevice can include a first conductive region and a second conductive region having a channel region interposed therebetween. The mircodevice can also include a channel region controlling component disposed over the channel region and separated therefrom by at least one dielectric layer. The channel region controlling component has a non-linear structural characteristic derived from a non-linear structural characteristic of a photo resist feature used as an etch mask for the channel region controlling component.

A further aspect of the microdevice can include that the non-linear characteristic of the photo resist feature provides mechanical stability to the photo resist feature.

According to another aspect of the invention, the invention is directed to a method of fabricating a microdevice for an integrated circuit. The method can include providing a wafer having a photo resist layer disposed over an underlying layer; exposing and developing the photo resist layer to form a photo resist feature having a non-linear structural characteristic, the non-linear characteristic of the photo resist feature providing mechanical stability to the photo resist feature; and etching the underlying layer to form a component of the microdevice from the underlying layer, the component having a non-linear structural characteristic corresponding to the non-linear characteristic of the photo resist feature.

BRIEF DESCRIPTION OF DRAWINGS

These and further features of the present invention will be apparent with reference to the following description and drawings, wherein:

FIG. 1 is a top view of a conventional photo resist line disposed on a wafer;

FIG. 2 is a cross-section of the conventional photo resist line taken along the line 2—2 of FIG. 1;

FIG. 3 is a top view of a plurality of example photo resist features according to an embodiment of the present invention;

FIG. 4A is a cross-section of a photo resist feature as used during the fabrication of an example microdevice according to the present invention and taken along the line 4—4 of FIG. 3;

FIG. 4B is a cross-section of the example microdevice manufactured using the photo resist feature of FIG. 4A;

FIG. 5 is a top view a memory device array according to the present invention;

FIG. 6 is a cross-section of one of the memory devices of the memory device array taken along the line 6—6 of FIG. 5;

FIG. 7 is a top view of a photo resist features according to an embodiment of the present invention;

FIG. 8 is a top view of a photo resist features according to another embodiment of the present invention;

FIG. 9 is a top view of a photo resist features according to yet another embodiment of the present invention; and FIG. 10 is a top view of a photo resist feature prior to deconstructive patterning to produce random elements from the photo resist feature.

DISCLOSURE OF INVENTION

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

The present invention relates to microdevices that are used to form part of an integrated circuit and methods of fabricating microdevices. The microdevices include at least one non-linear structural component that derives the non-linear characteristic from a photo resist feature used in the fabrication of the component. The methods include use of at least one non-linear photo resist feature. The use of non-linear photo resist features provides mechanical stability to the photo resist features that have a large aspect ratio (i.e., features with a dimension that is small relative to the height of the photo resist), such as an aspect ratio of greater than or equal to about 2.25 or, in another embodiment, an aspect ratio of greater then or equal to about 3.0. For example, a 80 nm resist line with a height greater than about 180 nm to about 200 nm could be prone to pattern collapse. As another example, relatively small resist features (e.g., 50 nm lines) with a height of about 150 nm could be prone to pattern collapse. Also, if a resist feature has a neighboring feature within about 1 to about 1.5 times the line width, the resist feature may be more prone to pattern collapse than if the neighboring feature were further away. As a result of the addition of a supporting feature, the likelihood that the photo resist feature having the non-linear characteristic will collapse is reduced. As indicated above, collapse of a photo resist features can include completely falling over, leaning in one or more directions, bowing, "slumping," or otherwise failing to remain upright and disposed in a desired direction. The present invention can be used in a wide variety of situations and can be particularly useful when forming a gate electrode for a transistor and/or when forming word lines for a memory cell array.

The present invention will be described in the exemplary context of the patterning of a polysilicon gate or word line that forms a part of an integrated circuit. However, the present invention can have application when forming (e.g., by patterning, etching, implanting or other processing) other parts of an integrated circuit, such as a gate or word line made from a material other than polysilicon (e.g., a metal), a dielectric layer, a source/drain layer, a metal interconnect layer, a contact layer, etc. Example integrated circuits include general use processors made from thousands or millions of transistors, a flash memory array or any other dedicated circuitry. However, one skilled in the art will appreciate that the methods and microdevice components described herein can also be applied to the process of manufacturing any article made using photolithography, such as micromachines, disk drive heads, gene chips, micro electromechanical systems (MEMS) and so forth.

Although not illustrated, the patterning of a photo resist layer can be carried out using an integrated circuit processing arrangement that includes a lithography system used to image a pattern onto the photo resist layer, or a region thereof. The system can be, for example, a step-and-repeat exposure system or a step-and-scan exposure system, but is not limited to these example systems. The system can include a radiation (e.g., light) source for directing energy towards a photomask (or reticle). The energy can have, for example, a deep ultraviolet wavelength (e.g., about 248 nm or about 193 nm), or a vacuum ultraviolet (VUV) wavelength (e.g., about 157 nm), although other wavelengths, including extreme ultraviolet wavelengths, are possible.

The mask selectively blocks (or, in some instances, selectively reflects) light energy such that a light energy pattern defined by the photomask is transferred towards a wafer coated with the photo resist layer. An imaging subsystem, such as a stepper assembly or a scanner assembly, sequentially directs the energy pattern transmitted by the mask to a series of desired locations on the wafer. The imaging subsystem may include a series of lenses and/or reflectors for use in scaling and directing the energy pattern towards the wafer in the form of an imaging energy pattern (or exposure dose).

Referring to FIG. 3 shown is a top view of a portion of a wafer 20 having a plurality of photo resist features 22 patterned thereon. As should be appreciated, the photo resist features 22 can be formed by coating the wafer 20 with a layer of photo resist material and selectively removing undesired photo resist material using a lithographic process.

The photo resist features 22 include intentionally patterned non-linear characteristics, which are intended to provide mechanical stability to the photo resist features 22. It is recognized that even when trying to pattern a straight photo resist line (e.g., the line 10 of FIG. 1), non-linearities are likely to occur as a result of the lithographic process and can include the results of optical proximity effects such as corner rounding and line end pull back as well as the results of process effects such as line edge roughness. These effects are also likely to occur for the photo resist features 22 having intentionally formed non-linear characteristics. Nevertheless, term non-linearity when used in conjunction with describing the physical characteristics of a photo resist features is expressly defined to exclude the occurrence of optical and/or process photo resist non-linearities.

In the example of embodiment of FIG. 3, the non-linear characteristics imparted to the photo resist features 22 is a curvature of the features 22 along a particular direction, such as the illustrated second direction. In the illustrated example, the non-linear aspect of the features 22 generally takes the form of a sinusoid. However, as will be discussed in greater detail below, other non-linear aspects are possible. In addition, the curves of the sinusoid need not be a regular repeating pattern. For example, comparing the non-linear sinusoid aspect of the feature 22 to a sinusoidal function (e.g., $A\sin(x\ a)$, where A is the amplitude, x is the independent variable and a is the phase angle), the feature 22 need not complete a full period, need not have a regular frequency, need not have a 1:1 duty cycle, need not have a regular amplitude and/or need not define a continuous function. Rather, the curved aspects of the feature 22 are arranged to reduce the possibility that the photo resist material of the feature 22 will collapse. Specifically, the feature 22 having the non-linear aspect(s) is disposed over the wafer 20 using a greater amount of surface area, thereby creating a larger foot-print and more resistance to collapse, than a conventional linear photo resist feature.

In one embodiment, the non-linear photo resist feature 22 can be used in the formation of a transistor, such a MOSFET. It this embodiment, it may be preferable that the photo resist feature 22 has edges that are generally parallel to one another (e.g., similar to that of train tracks). Also, it may be desirable that the photo resist feature 22 has a generally constant "widthwise" dimension. By example, arrow B in FIG. 3 is a bisector to a gate electrode patterning feature 24 and, at any point measured generally perpendicular to the bisector B, the feature 24 can have a generally constant dimension identified by arrows D.

With additional reference to FIG. 4A, the gate electrode patterning photo resist feature 24 and the wafer 20 are shown in cross section. The example wafer 20 can include a polysilicon layer 26 disposed under the photo resist feature 24. The polysilicon layer 26 can be disposed over a dielectric layer that, in turn, can be disposed over a semiconductor layer 28. The semiconductor layer 28 can be a bulk active layer or a semiconductor layer arranged in semiconductor-on-insulator format. With further reference to FIG. 4B, shown is a cross section of the same area of the wafer 20 as shown in FIG. 4A, but after the polysilicon layer 26 is patterned to form a gate electrode 32 using the feature 24 as an etch mask. For clarity of the drawing figures, some of the cross-hatching in FIG. 4B has been omitted. Following implantation of a source 34 and a drain 36, the gate electrode 32 can be used to control a channel region 38 interposed between the source 34 and the drain 36. Accordingly, the length of the bisector B can define the width of the gate electrode 32 and the generally constant dimension D can define the length of the gate electrode 32. Furthermore, the dimension D contributes to defining the channel length of the device. Other factors contributing to channel length can include, for example, diffusion of ions implanted to form the source 34 and drain 36, use of sidewall spacers and liners, presence of extensions, and so forth.

It some situations it may be desirable to introduce non-uniformities in the general parallel nature of the feature 22, 24 edges to impart desired electrical characteristics to the device being made. For example, the arcs of the illustrate features 24 can have a tendency to introduce "pinch points" in the channel where current is more likely to flow from source to drain and/or introduce differences in the current density at the source/channel junction relative to the drain/channel junction. In this case, slight bowing or tapering of the edges of the feature 24 can be used to control channel placement. In this alternative, the generally constant dimension D may not be physically constant, but the edges of the feature 24 are formed to impart a generally electrical constant dimension from source 34 to drain 36.

In an alternative embodiment, the transistor can be arranged so that the source 34 and drain 36 are disposed adjacent ends of the gate electrode 32 formed from the feature 24. In this arrangement, the dimension B can contribute to defining the channel length and the dimension D can contribute to defining the width of the gate electrode.

Turning to FIG. 5, shown is a memory device array 40 fabricated using a plurality of photo resist features 22 (FIG. 3) having non-linear aspects. The memory device array 40, can be, for example, an array of dielectric charge trapping flash memory devices (sometimes referred to in the art as SONOS devices) or an array of floating gate flash memory devices. The illustrated example shows an array of dielectric charge trapping flash memory devices that store at least two programmed charge units per channel region. The conventional architecture and operation of dielectric charge trapping flash memory devices is relatively well-known and will not be discussed in great detail herein.

With additional reference to FIG. 6, which shows a cross section of an individual dielectric charge trapping flash memory device 42, the memory device array 40 can include a plurality of conductive bit lines 44 (e.g., made from doped silicon or a silicide) formed in a semiconductor substrate 46 (e.g., P type silicon) of a wafer 48. A plurality of word lines 50 (e.g., made from doped polysilicon or a metal) can be disposed over the substrate 46 and in a direction traveling generally perpendicular to the bit lines 44. The word lines 50 and the bit lines 44 can be separated by a stack of dielectric layers 52 including a bottom dielectric layer (also referred to a tunnel dielectric layer 54, which can be made from, for example, silicon oxide), a charge trapping dielectric layer 56 (e.g., made from silicon nitride) disposed over the tunnel dielectric layer 54 and a top dielectric layer 58 (e.g., made from silicon oxide) disposed over the charge trapping dielectric layer 56.

As illustrated, the word lines 50 can include a non-linear aspect imparted from a corresponding collapse minimizing aspect of a photo resist feature 22. The word lines 50 can be formed by disposing a layer of word line material over the top dielectric layer 58, coating the layer of word line material with a layer of photo resist and patterning the photo resist to have features 22 (FIG. 3) with non-linear aspects. Thereafter, the layer of word line material can be etched using the features 22 as an etch mask such that the non-linear aspects of the features are imparted to the word lines 50. As should be appreciated, the word lines 50 operatively define channel regions 60 interposed between adjacent pairs of bit lines 44, where each channel region has a channel length indicated by arrow CL.

The word lines 50 can be formed such that substantial bends or arcing of the channel is minimized. In this manner, electron injection from the channel to the charge trapping layer 56 can be carried out in a desired fashion.

FIGS. 7–9 illustrate alternative embodiments for photo resist features having non-linear characteristics. Each of these alternatives could be used in the fabrication of multiple types of microdevices, including, without limitation, MOSFETs and flash memory devices. Although the examples of FIGS. 7–9 show repeating patterns, it should be recognized that the illustrated features are examples used to show non-linear aspects. Comparing the illustrated repeating patterns to waveforms, similar photo resist features can be patterned but those features need not complete a full period, need not have a regular frequency, need not have a 1:1 duty cycle, need not have a regular amplitude and/or need not define a continuous function.

FIG. 7 shows example features 62 having a triangular, or "saw tooth," non-linear pattern. In some embodiments, it may be preferable that the photo resist feature 62 has edges that are generally parallel to one another (e.g., similar to that of train tracks) and that the feature have a generally constant dimension when measured generally perpendicular to a bisector of the feature 62.

Vertices 63 of the saw tooth pattern can have pointed transitions as shown or radiused transitions. In one example application, a saw toothed photo resist feature 62 having one or two vertices 63 (or "bends") can be used in the formation of a gate electrode for a transistor device having a corresponding saw toothed shape. In another application, an elongated photo resist feature 62 having multiple bends can be used in the formation of a word line having a corresponding saw toothed shape for a memory device array. To maintain a relatively straight channel for each memory device of the memory device array, the bit lines can be positioned to intersect the vertices 63 such that the channel region underlies a substantially linear portion of the feature 62.

FIG. 8 shows an example feature 64 having a crenelated, or "square wave," non-linear pattern. In some embodiments, it may be preferable that the photo resist feature 64 has edges that are generally parallel to one another (e.g., similar to that of train tracks) and that the feature has a generally constant dimension measured generally perpendicular to a bisector of the feature 62. In another embodiment, the saw tooth of feature 62 and/or the sinusoidal pattern of feature 22 can be combined with the crenelated feature 64 to provide angled or rounded corners rather than the right angles shown in FIG. 8.

FIG. 9 shows an example photo resist feature 66 having sections 68 with a desired dimension for use when patterning a gate electrode or word line and with one or more support tabs 70 located in non-critical locations relative to the integrated circuit undergoing fabrication. The support tabs 70 can be formed by increasing the first direction dimension of the feature 66. Although illustrated as being rectangular, the support tabs 70 can have any geometrical configuration (e.g., arcuate, triangular, etc) that adds stability to the overall feature 66. The tab 70 or tabs 70 of any particular feature 66 can be located at an end of the feature 66 and/or between ends of the feature 66. The sections 68 can be linear or non linear (e.g., curved or arced, saw toothed, crenelated, etc.).

In one example application, the section 68 can be used in the formation of a gate electrode for a transistor device. In another application, an elongated photo resist feature 66 with multiple tabs 70 can be used in the formation of a word line for a memory device array. To maintain a relatively uniform channel for each memory device of the memory device array, the bit lines can be positioned to intersect the tabs 70 such that the channel region underlies the sections 68 of the feature 66.

As should be appreciated, the illustrated features 22, 62, 64 and 66 show example non-linear aspects that can be imparted to a photo resist feature. Other types of non-linear aspects and geometries for increasing the stability of a photo resist feature can exist and are considered to fall within the scope of the invention as defined by the claims appended hereto.

In yet another embodiment, a photo resist feature or multiple photo resist features (e.g., one or more of the features 22, 62, 64 and 66) can be formed on a wafer. Thereafter, the features can be patterned again to remove undesired portions of the features. As an example, FIG. 10 shows dashed rectangles 72 surrounding potentially undesired portions of the feature 22. These undesired areas can be subjected to a lithography process resulting in the removal of the undesired areas. The desired portions remaining after this "deconstructive" patterning can be used, for example, in the formation of gate electrodes. In this embodiment, one or more photo resist features (e.g., one or more of the features 22, 62, 64 and 66) are formed and then random elements (e.g., smaller photo resist features) are patterned from the photo resist features. The photo resist features can initially be disposed on the wafer in a random pattern or as part of a regular array having a desired pitch (e.g., having a regular line width for each feature and regular spacing between features). It is noted that, the random elements preferably include supporting features and/or non-linear characteristics to maintain the stability of the random elements.

In a variation of the foregoing deconstructive patterning technique, a photo resist feature or multiple photo resist features (e.g., one or more of the features 22, 62, 64 and 66) can be formed on a wafer. Thereafter, the features can be used as an etch mask to form corresponding structures from an underlying layer. Then, the structures made from the underlying layer can be pattern again to remove undesired portions of the structures. These undesired areas can be subjected to a lithography process resulting in the removal of the undesired areas. The desired portions remaining after this "deconstructive" patterning can be used, for example, as gate electrodes. In this embodiment, one or more structures corresponding to photo resist features (e.g., one or more of the features 22, 62, 64 and 66) are formed and then random elements (e.g., smaller underlying layer structures to serve as device components) are patterned from the layer patterned in accordance with the photo resist features. The photo resist features can initially be disposed on the wafer in a random pattern or as part of a regular array having a desired pitch (e.g., having a regular line width for each feature and regular spacing between features).

Although particular embodiments of the invention have been described in detail, it is understood that the invention is not limited correspondingly in scope, but includes all changes, modifications and equivalents coming within the spirit and terms of the claims appended hereto.

What is claimed is:

1. A transistor for forming a part of an integrated circuit, comprising:
   a first conductive region forming a source and a second conductive region forming a drain having a channel region interposed therebetween; and
   a channel region controlling component forming a gate electrode disposed over the channel region and separated therefrom by at least one dielectric layer, wherein the channel region controlling component has a non-linear structural characteristic derived from a non-linear structural characteristic of a photo resist feature used as an etch mask for the channel region controlling component,
   wherein the non-linear characteristic of the photo resist feature is selected to provide provides mechanical stability to the photo resist feature; and
   wherein at any point measured from the source to the drain in a perpendicular direction to a widthwise bisector of the gate electrode, the gate electrode defines a channel length having a substantially constant dimension.

2. The microdevice according to claim 1, wherein the non-linear characteristic of the photo resist feature includes an arc.

3. The microdevice according to claim 1, wherein the non-linear characteristic of the photo resist feature includes a vertex.

4. The microdevice according to claim 1, wherein the non-linear characteristic of the photo resist feature includes a tab extending laterally beyond a width of the photo resist feature and located with respect to the channel region controlling component outside a gate electrode portion thereof.

5. The microdevice according to claim 1, wherein the channel region controlling component is made by deconstructive patterning of one of the photo resist feature or a structure patterned using the photo resist feature.

6. The microdevice according to claim 1, wherein the generally constant dimension is one of a physical dimension or an electrical dimension.

7. A flash memory device for forming a part of an integrated circuit, comprising:
- a plurality of conductive regions forming bit lines with a channel region interposed between adjacent pairs of bit lines; and
- a word line arranged transverse to each bit line and disposed over each channel region to form a control gate therefor, the word line separated from each channel region by at least one dielectric layer and a charge storing layer, wherein the word line has a non-linear structural characteristic derived from a non-linear structural characteristic of a photo resist feature used as an etch mask for the channel region controlling component,
- wherein the non-linear characteristic of the photo resist feature is selected to provide mechanical stability to the photo resist feature; and
- wherein the non-linear structural characteristic displaces the word line along a longitudinal axis thereof and each channel has substantially the same channel length as defined by the word line.

8. The flash memory device according to claim 7, wherein each channel is defined by a local portion of the word line that has electrical linearity.

9. The flash memory device according to claim 7, wherein the non-linear structural characteristic of the word line forms a repeating pattern along the longitudinal axis of the of the word line.

10. The flash memory device according to claim 7, wherein the non-linear characteristic of the photo resist feature includes an arc.

11. The flash memory device according to claim 7, wherein the non-linear characteristic of the photo resist feature includes a vertex.

12. The flash memory device according to claim 7, wherein the non-linear characteristic of the photo resist feature includes a tab extending laterally beyond a width of the photo resist feature and located with respect to the word line outside the control gate portions thereof.

13. The microdevice according to claim 7, wherein the flash memory device is a dielectric charge trapping flash memory device.

* * * * *